United States Patent [19]
Petty et al.

[11] Patent Number: 5,675,268
[45] Date of Patent: Oct. 7, 1997

[54] OVERCURRENT DETECTION CIRCUIT FOR A POWER MOSFET AND METHOD THEREFOR

[75] Inventors: Thomas D. Petty, Tempe; Troy L. Stockstad, Phoenix; Warren J. Schultz, Tempe, all of Ariz.

[73] Assignee: Motorola, Inc., Schaumburg, Ill.

[21] Appl. No.: 538,522

[22] Filed: Oct. 3, 1995

[51] Int. Cl.⁶ .............................. H03K 5/153; H03K 5/22
[52] U.S. Cl. ................... 327/77; 327/74; 327/81; 327/88; 327/432
[58] Field of Search ....................... 327/77, 80, 81, 327/103, 427, 432–436, 574, 577, 581, 480, 375, 579, 108, 88, 85, 530, 546, 545, 50, 51, 74

[56] References Cited

U.S. PATENT DOCUMENTS

| | | | |
|---|---|---|---|
| 4,453,091 | 6/1984 | Katakura et al. | 327/50 |
| 4,749,880 | 6/1988 | Kobatake | 327/63 |
| 4,980,578 | 12/1990 | Shaffer et al. | 327/51 |
| 5,113,089 | 5/1992 | Osawa | 327/77 |
| 5,187,387 | 2/1993 | Kawauchi | 327/50 |
| 5,374,857 | 12/1994 | Carsbolante | 327/427 |

FOREIGN PATENT DOCUMENTS 59-64916  4/1984  Japan.

*Primary Examiner*—Toan Tran
*Attorney, Agent, or Firm*—Gary W. Hoshizaki; Sharon K. Coleman

[57] ABSTRACT

An overcurrent detector circuit (21) for a power MOSFET (22) is described. The overcurrent detector circuit (21) generates a bias voltage corresponding to the drain to source voltage of the power MOSFET (22). The drain to source voltage correlates directly to the current being conducted by the power MOSFET (22). An overcurrent condition occurs when the power MOSFET (22) exceeds a predetermined current. The bias voltage is applied to a transistor (24) for generating a current. A current source (29) couples to the transistor (24). The current provided by the transistor equals the reference current of the current source (29) when the power MOSFET conducts the predetermined current. The overcurrent detector circuit (21) generates a signal indicating a overcurrent condition does not exist when the reference current is greater the current provided by the transistor. Conversely, the overcurrent detector circuit (21) generates a signal indicating the overcurrent condition when the current provided by the transistor exceeds the reference current.

10 Claims, 2 Drawing Sheets

OVERCURRENT DETECTION CIRCUIT FOR A POWER MOSFET AND METHOD THEREFOR

BACKGROUND OF THE INVENTION

This invention relates, in general, to current detection, and more particularly, to overcurrent detection for a high voltage power Metal Oxide Semiconductor Field Effect Transistor (MOSFET).

Discrete power transistors are typically one of the most expensive components in a system. Power transistors are designed for high voltage and high current applications and are not easily integrated with high density digital or analog circuitry. A power transistor, when stressed beyond it's limitations, can be damaged resulting in either the power transistor failing or in a worst case causing catastrophic failure to the entire system.

Current detection, and more particularly, overcurrent detection indicates when the maximum current of a power transistor is exceeded. An overcurrent detector circuit should not interfere with the performance of the power transistor under normal operating conditions. Upon detecting an overcurrent condition an overcurrent detector circuit provides a signal indicating the overcurrent condition for enabling circuitry to turn off the power transistor before damage occurs.

It would be of great benefit if a overcurrent detection circuit could be provided that rapidly detects an overcurrent condition without affecting performance of a power transistor.

DETAILED DESCRIPTION OF THE DRAWINGS

An overcurrent detection circuit provides a signal when the current of a power transistor exceeds a predetermined current. The predetermined current is a function of the maximum power handling capability of the power transistor. In general, the predetermined current is selected below the maximum current of a power transistor which allows the overcurrent detection circuit sufficient time to disable the power transistor before a damaging current is generated.

Figure 1:
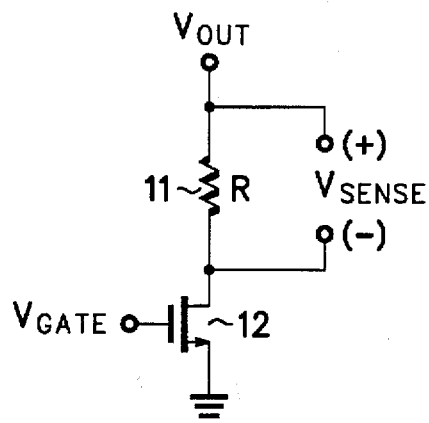
FIG. 1 is a schematic diagram of a prior art sense circuit for detecting current of a power Metal Oxide Semiconductor Field Effect Transistor (MOSFET)

FIG. 1 is a prior art schematic diagram of a sense technique commonly used in determining a current magnitude of a power transistor. A resistor 11 is coupled in series with a power transistor 12 to generate a voltage which is proportional to the current conducted by power transistor 12. Power transistor 12 has an extremely low on-resistance for conducting high currents. Resistor 11 must also have an extremely low resistance to prevent performance degradation of power transistor 12. Still, any value of series resistance decreases performance and increases a voltage at an output Vout when power transistor 12 is enabled. Resistor 11 must be capable of handling all the current conducted by power transistor 12. A resistor capable of handling high currents is not easily integrated in an integrated circuit. In general, a discrete resistor is used which adds cost and complexity to the manufacture of a system.

Overcurrent detection is achieved by monitoring the voltage (Vsense) across resistor 11. Resistor 11 has a resistance R1. Power transistor 12 is enabled for conducting current by a voltage applied to an input Vgate. The current conducted by power transistor 12 is Vsense/R1. A comparator (not shown) is coupled to resistor 11 for sensing the voltage Vsense. The comparator provides a signal indicating an overcurrent condition when a predetermined voltage is generated across resistor 11. The predetermined voltage corresponds to the predetermined current as calculated by the equation stated hereinabove.

Figure 2:
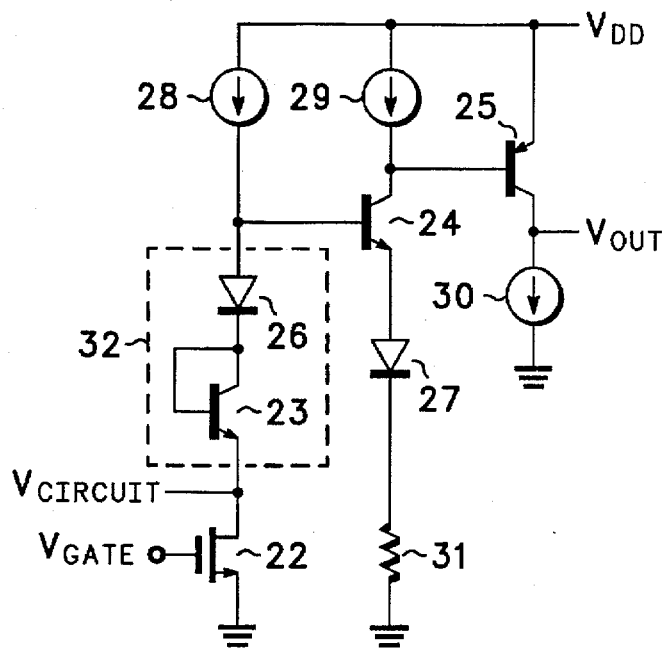
FIG. 2 is schematic diagram of a overcurrent detection circuit in accordance with the present invention.

FIG. 2 is a schematic diagram of an overcurrent detector circuit 21 in accordance with the present invention. Overcurrent detector circuit 21 is placed outside the current path of a power Metal Oxide Semiconductor Field Effect Transistor (MOSFET) 22, thus power sense resistors are not used in the circuit. In the preferred embodiment, overcurrent detector circuit 21 is processed in a low voltage integrated circuit process for high density circuitry. Power MOSFET 22 drives circuitry (not shown) connected to output Vcircuit. It should be noted that high voltages, for example, voltages greater than 30 volts can be coupled to the output Vcircuit when power MOSFET 22 is disabled. Overcurrent detector circuit 21 includes circuitry for withstanding high voltages applied to the output Vcircuit.

Overcurrent detector circuit 21 comprises transistors 23–25, high voltage diodes 26–27, current sources 28–30, and resistor 31. In the preferred embodiment, transistors 23 and 24 are bipolar NPN transistors, and transistor 25 is a bipolar PNP transistor. Transistors 23–25 have a collector, a base, and an emitter corresponding to a first electrode, a control electrode, and a second electrode. High voltage diodes 26 and 27 have a reverse breakdown voltage sufficient to protect overcurrent detector circuit 21 from a high voltage applied to the output Vcircuit.

Power MOSFET 22 has a gate connected to an input Vgate, a drain connected to the output Vcircuit, and a source connected for receiving a power supply voltage (e.g. ground). Transistor 23 and high voltage diode 26 form a level shift circuit 32. Level shift circuit 32 generates a voltage that is proportional to the voltage at the drain of power MOSFET 22. Transistor 23 has the collector and base coupled in common, and the emitter coupled to the output Vcircuit. High voltage diode 26 has an anode, and a cathode connected to the collector of transistor 23. Current source 28 provides bias current to transistor 23 and high voltage diode 26 when power MOSFET 22 is enabled. Current source 28 has a first terminal connected to a power supply terminal Vdd and a second terminal coupled to the anode of high voltage diode 26.

Current source 29 provides a bias current or a reference current to transistor 24, high voltage diode 27, and resistor 31. A difference current is generated between the reference current of current source 29 and transistor 24 for generating a signal indicating whether an overcurrent condition exists. Current source 29 has a terminal connected to the power supply terminal Vdd and a second terminal. Transistor 24 has a collector connected to the second terminal of current source 29, a base connected to the anode of high voltage diode 26, and an emitter. High voltage diode 27 has an anode coupled to the emitter of transistor 24, and a cathode. Resistor 31 has a first terminal coupled to the cathode of high voltage diode 27 and a second terminal connected to ground.

Transistor 25 and current source 30 form an output stage for generating a logic signal indicating an overcurrent condition exists in power MOSFET 22. Transistor 25 has a collector connected to an output Vout, a base connected to the collector of transistor 24, and an emitter connector to the power supply terminal Vdd. Current source 30 has a first terminal connected to the output Vout and a second terminal connected to ground.

Overcurrent detector circuit 21 has two modes of operation. In a first mode of operation, power MOSFET 22 is disabled by a signal applied to the input Vgate. Circuitry (not shown) connected to the output Vcircuit can drive the output Vcircuit to a voltage that could damage overcurrent detector circuit 21. Transistor 23 (in a diode configuration) and diode 26 become reverse biased as the voltage at output Vcircuit approaches the power supply voltage applied to power supply terminal Vdd. In the preferred embodiment, high voltage diode 26 has a reverse breakdown voltage greater than any voltage applied to the output Vcircuit. Current source 28 drives the base of transistor 24 to sink a current larger than the current provided by current source 29. Transistor 25 is enabled under this condition driving the output Vout to a logic one level. Under normal conditions this would indicate an overcurrent condition exists but it is ignored because power MOSFET 22 is disabled. For example, simple logic circuitry such as an AND gate could be added. A first input of the AND connects to the input Vgate and a second input connects to the output Vout. The AND outputs a logic zero level whenever power MOSFET 22 is disabled.

In a second mode of operation, power MOSFET 22 is enabled by a signal applied to the input Vgate. The voltage at the output Vcircuit is reduced to a voltage approaching ground. The actual voltage at the output Vcircuit is a function of the on-resistance of power MOSFET 22. For example, a power MOSFET having an on-resistance of 0.105 ohms would have a drain to source voltage of 210 millivolts when conducting 2 amperes. high voltage diode 26 and transistor 23 are biased by current source 28. The voltage at the base of transistor 24 is equal to the sum of the voltages across high voltage diode 26, transistor 23, and power MOSFET 22. In the preferred embodiment, current sources 28 and 29 have equal currents, high voltage diodes 26 and 27 have equal conductive areas, and transistors 23 and 24 have equal conductive areas. High voltage diodes 26 and 27 have the same construction to match their operating characteristics. Similarly, transistors 23 and 24 are made identical to have the same operating characteristics. The voltage drop from the anode of high voltage diode 26 to the emitter of transistor 23 is approximately the same as the voltage drop from the base of transistor 24 to the cathode of high voltage diode 27 when biased by equal magnitude currents. Under this condition, the voltage at the output Vcircuit (the drain voltage of power MOSFET 22) is approximately the same as the voltage drop across resistor 31. The trip point at which an overcurrent condition exists is determined by selecting a resistor value for a condition of equal currents through transistors 23 and 24, and high voltage diodes 26 and 27.

A predetermined current conducted by power MOSFET 22 is chosen as a threshold or trip point for indicating an overcurrent condition. The predetermined current is typically less than a maximum current that can damage power MOSFET 22. A drain voltage of power MOSFET 22 at the predetermined current is determined by empirical characterization, simulation, or from a data sheet. A voltage drop across a power MOSFET is directly related to the on-resistance of the device. The resistance value of resistor 31 and the current magnitude of current source 29 are selected to coincide with the predetermined current. As mentioned previously, the voltage at the output Vcircuit is approximately equal to the voltage drop across resistor 31 when equal currents bias transistors 23 and 27, and high voltage diodes 26 and 27 (the trip point of the circuit). A resistor value (R) of resistor 31 is selected such that R times the current magnitude of current source 29 equals the voltage at the output Vcircuit when power MOSFET 22 is conducting the predetermined current.

In a first case, power MOSFET 22 conducts less than the predetermined current. The voltage at the base of transistor 24 is insufficient for enabling transistor 24 to sink the full current output of current source 29. Transistor 25 is turned off as current source 29 drives the voltage at the base of transistor 25 to the power supply voltage. Current source 30 pulls the output Vout to ground (logic zero level). A logic zero level at the output Vout indicates that an overcurrent condition does not exist.

In a second case, a current conducted by power MOSFET 22 exceeds the predetermined current. The voltage at the base of transistor 24 increases from the first case as described hereinabove due to the higher current conducted by power MOSFET 22. The voltage across power MOSFET 22 is sufficient to generate a voltage across resistor 31 such that transistor 24 is enabled for sinking a current greater than the current provided by current source 29. In other words, the increased voltage across power MOSFET 22 increases the bias current of transistor 24. Transistor 25 is enabled by transistor 24 under this condition. Transistor 25 drives the output Vout to a logic one level indicating an overcurrent condition exists.

An example using a resistor value and current values best illustrates the operation of overcurrent detector circuit 21. A voltage of three volts is applied to power supply terminal Vdd which is common for many integrated circuit processes. An overcurrent condition exists when power MOSFET 22 conducts more than 2 amperes. Power MOSFET 22 is characterized having a 210 millivolt drain to source voltage when conducting 2 amperes of current.

Circuitry coupled to the output Vcircuit can provide a voltage of up to 60 volts to the output when power MOSFET 22 is not enabled. Diodes 26 and 27 have a reverse breakdown voltage exceeding 60 volts to protect overcurrent detector circuit 21 when a high voltage is applied to the output Vcircuit.

Overcurrent detector circuit 21 operates at low power by minimizing currents from current sources 28–30. Current sources 28 and 29 provide a current of 3 microamperes. Current source 30 provides a current of 1 microampere. Power MOSFET 22 conducts the current of current source 28 when enabled. The current of current source 28 is negligible in comparison to the total current conducted by power MOSFET 22. The 3 microampere current of current source 28 biases high voltage diode 26 and transistor 23 when power MOSFET 22 is enabled. The voltage at the base of transistor 24 is the combined voltages across, high voltage diode 26, transistor 23, and power MOSFET 22.

In the preferred embodiment, transistor 24 is biased by the voltage at the base of transistor 24 to conduct a current equal to the current (3 microamperes) of current source 29 when power MOSFET 22 conducts the predetermined current (2 amperes). Transistors 23 and 24, and high voltage diodes 26 and 27 have equal conductive areas to produce identical voltage drops when biased by the same current. The voltage across resistor 31 is selected to equal the voltage across power MOSFET 22 (drain to source voltage) at the predetermined current. The voltage across resistor 31 at the predetermined current (2 amperes) is 210 millivolts as mentioned hereinabove. The resistor value of resistor 31 to insure an overcurrent condition of 2 amperes is 210 (millivolts)/3 (microamperes)=70 kiloohms. The resistor value corresponds to the voltage across the power MOSFET at the predetermined current divided by the current of current source 29.

The voltage at the output Vcircuit is greater than 210 millivolts when the current conducted by power MOSFET 22 exceeds 2 amperes. The voltage at the base of transistor 24 is sufficient to enable transistor 24 to conduct a current greater than 3 microamperes. Current in excess of the 3 microamperes provided by current source 29 is received by transistor 24 from the base of transistor 25, thereby enabling transistor 25 for driving the output Vout to a logic one level indicating the overcurrent condition.

Conversely, a voltage less than 210 millivolts at the output Vcircuit corresponds to a condition where power MOSFET 22 is operating safely. The bias voltage at the base of transistor 24 is less than the required bias voltage for transistor 24 to sink 3 microamperes. This corresponds to the fact that power MOSFET 22 has less than a 210 millivolt voltage drop from drain to source. Transistor 25 is disabled since the excess current of current source 29 drives the base of transistor 25 to the power supply voltage of power supply terminal Vdd. Current source 30 pulls the output Vout to a logic zero level (ground) indicating an overcurrent condition does not exist.

Figure 3:
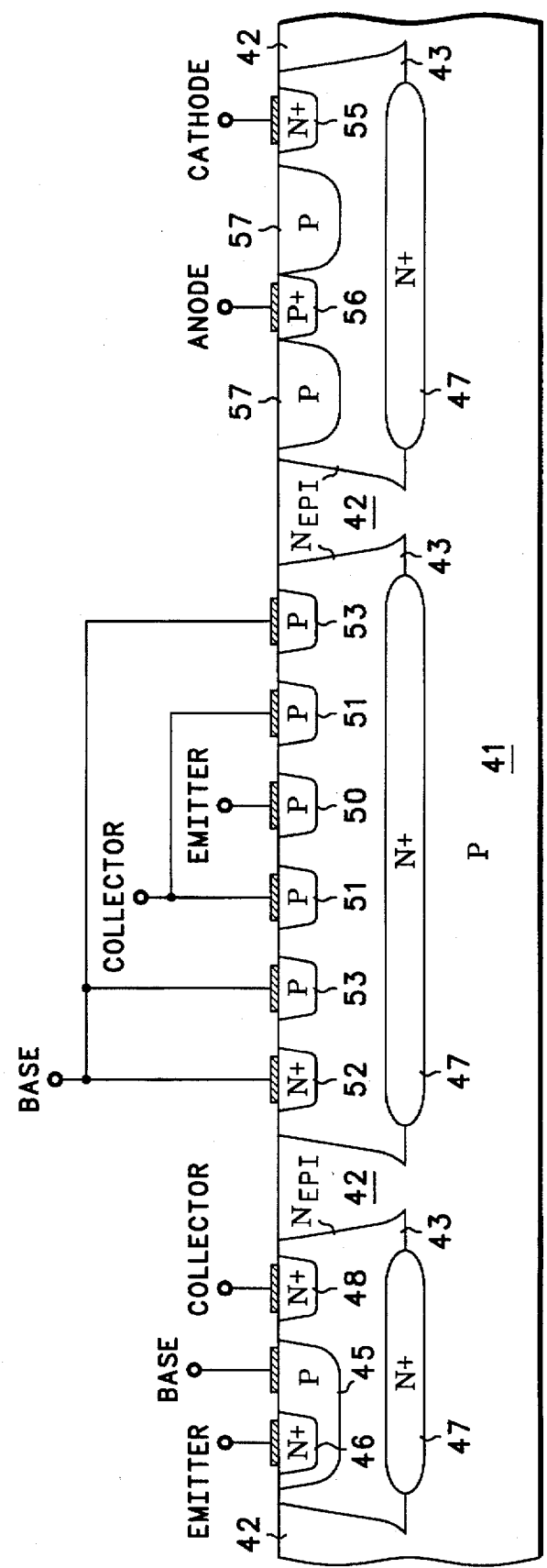
FIG. 3 is a cross-sectional view of a low voltage integrated circuit design process illustrating some of the devices of the overcurrent detection circuit of FIG. 2.

FIG. 3 is a cross-sectional semiconductor wafer view of devices used in the overcurrent detector circuit of FIG. 2. In the preferred embodiment, a semiconductor wafer process having NPN and PNP bipolar transistors is used. An n-epitaxial layer 43 is grown on a p-substrate 41. P-isolation regions 42 are used to isolate devices from one another as is well known by one skilled in the art.

An NPN transistor 44 comprises a p-well base region 45 formed in epitaxial layer 43 and a n+ emitter region formed in p-well 45. Epitaxial layer 43 forms a collector region for NPN transistor 44. NPN transistor 44 is formed as a vertical structure. A buried layer 47 provides a low impedance path to a n+ collector contact 48. NPN transistor 44 corresponds to transistors 23 and 24 of FIG. 2.

A lateral PNP transistor 49 comprises a p-well emitter region 50 formed in epitaxial layer 43 encircled by a p-well collector region 51 formed in epitaxial layer 43. Epitaxial layer 43 is a base region for lateral PNP transistor 49. Buried layer 47 provides a low impedance path through epitaxial layer 43 to n+ base contact region 52. Epitaxial layer 43 also prevents transistor action to a vertical substrate transistor having p-substrate 41 as a collector. Lateral PNP transistor 49 corresponds to PNP transistor 25 of FIG. 2. A second p-well collector region 53 is formed in epitaxial layer 43 which rings p-well collector region 51. P-well collector region 53 is coupled to the base of lateral PNP transistor 49. Referring to FIG. 2, transistor 25 can be driven into a saturation region of operation when transistor 24 is enabled. High currents could be generated at the base of transistor 25 in this condition, which is not desirable. Referring back to FIG. 3, p-well collector region 53 is added to lateral PNP transistor 49 to reduce saturation currents of the device.

A high voltage diode 54 having a high reverse breakdown voltage is formed using implants standard to a bipolar wafer process flow. Epitaxial layer 43 forms a cathode of high voltage diode 54. A n+ region 55 is a cathode contact for epitaxial layer 43. A p-region 56 forms an anode of high voltage diode 54. A p-well 57 is placed around p-region 56 to increase reverse breakdown voltage of high voltage diode 54. P-well 57 increases reverse breakdown voltage by reducing peak electrical fields at the edges of the implant where electrical fields are highest. Buried layer 47 prevents p-substrate 41 from acting as a collector region. P-well region 56 and epitaxial layer 43 are not heavily doped which increases the reverse breakdown voltage of the device. High voltage diode 54 corresponds to high voltage diodes 26 and 27 of FIG. 2.

Referring back to FIG. 2, current sources 28 and 29 are formed from lateral PNP transistors or a p-channel Metal Oxide Semiconductor Field Effect Transistors (MOSFETs) if available in the semiconductor process. Current source 30 is formed from a NPN transistor or a n-channel MOSFET. In the preferred embodiment, resistor 31 is a discrete resistor to insure an accurate resistor value is provided since it determines when an overcurrent condition is indicated. A trimmable resistor could also be used if resistor 31 is integrated with the rest of the circuitry of overcurrent detector circuit 21.

Figure 4:
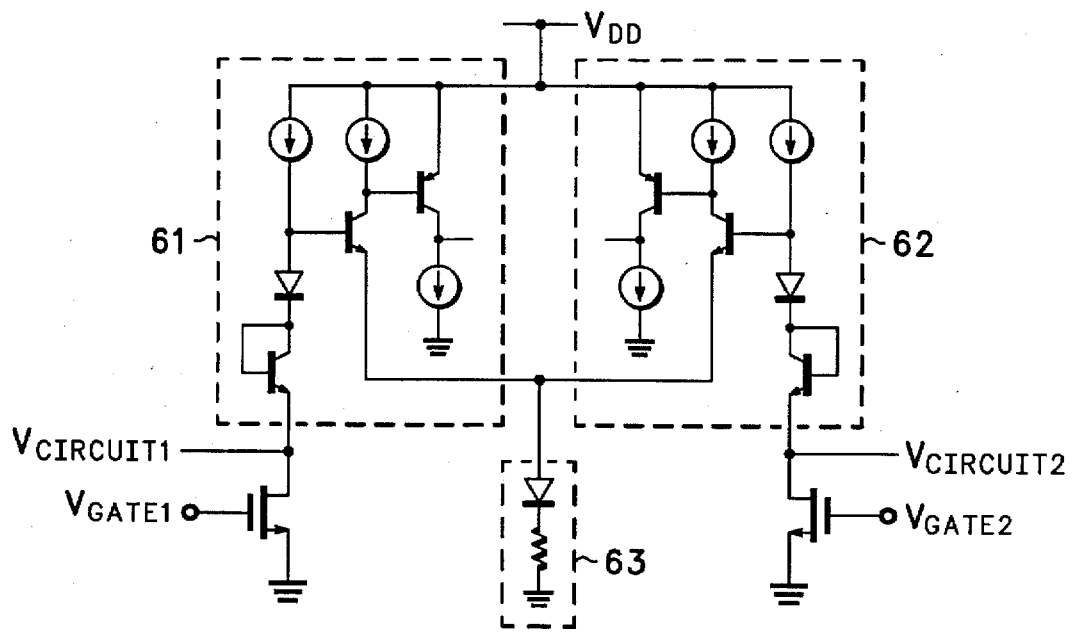
FIG. 4 is a schematic diagram of multiple overcurrent detection circuits.

FIG. 4 is a schematic diagram illustrating an overcurrent detector circuit for detecting overcurrent in more than one power MOSFET. Each power MOSFET has the same predetermined current at which an overcurrent condition occurs. The overcurrent detector circuit has a first circuit 61 for a first power MOSFET and a second circuit 62 for a second power MOSFET. First circuit 61 and second circuit 62 are identical to one another and operates similar to overcurrent detector circuit 21 of FIG. 2. Circuit 63 comprises a high voltage diode and a resistor. Circuit 63 sets the predetermined current at which either first circuit 61 or second circuit 62 generates a signal indicating an overcurrent condition. Sharing the high voltage diode and resistor with multiple overcurrent detector circuits reduces component count and manufacturing costs. Adding circuits similar to 61 and 62 would allow overcurrent detection for other power MOSFETs.

By now it should be appreciated that an overcurrent detector circuit has been provided. The overcurrent detector circuit is not placed directly in the current path of a power MOSFET, thus it does not affect the performance of the power MOSFET. A voltage corresponding to the voltage across the power MOSFET (drain to source voltage) is used to bias a transistor (transistor 24 of FIG. 2). The drain to source voltage of the power MOSFET increases as the current conducted by the power MOSFET increases. The current of the transistor is compared against a reference current (current source). If the current provided by the transistor is less than the reference current an overcurrent condition does not exist. The current provided by the transistor increases as the current conducted by the power MOSFET increases. An overcurrent condition exists when the current provided by the transistor is greater than the reference current. The overcurrent detector circuit generates a signal indicating the overcurrent condition. The current of the power MOSFET at which the reference current equals the current provided by the transistor is a predetermined current corresponding to a trip point of the overcurrent detector circuit.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

We claim:

1. An overcurrent detector circuit for detecting when a predetermined current of a power Metal Oxide Semiconductor Field Effect Transistor (MOSFET) is exceeded, the overcurrent detector circuit having an input and an output, the power MOSFET having a drain coupled to the input of the overcurrent detector circuit, a gate coupled for receiving a control signal, and a source coupled for receiving a first power supply voltage, the overcurrent detector circuit comprising:

a first transistor of a first conductivity type having a first electrode and a control electrode coupled in common, and a second electrode coupled to the input of the overcurrent detector circuit;

a first diode having a first electrode and a second electrode coupled to said first electrode of said first transistor;

a first current source having a first terminal coupled for receiving a second power supply voltage and a second terminal coupled to said first electrode of said first diode;

a second transistor of said first conductivity type having a first electrode, a control electrode coupled to said first electrode of said first diode, and a second electrode;

a second diode having a first electrode coupled to said second electrode of said second transistor and a second electrode;

a resistor having a first terminal coupled to said second electrode of said second diode and a second terminal coupled for receiving said first power supply voltage;

a second current source having a first terminal coupled for receiving said second power supply voltage and a second terminal coupled to said first electrode of said second transistor;

a third transistor of a second conductivity type having a first electrode coupled to the output of the overcurrent detector circuit, a control electrode coupled to said first electrode of said second transistor, and a second electrode coupled for receiving said second power supply voltage; and a third current source having a first terminal coupled to said first electrode of said third transistor and a second terminal coupled for receiving said first power supply voltage.

2. The overcurrent detector circuit as recited in claim 1 wherein said first and second transistors have equal conductive areas, wherein said first and second diodes have equal conductive areas, and wherein said first and second current source provide equal currents.

3. The overcurrent detector circuit as recited in claim 2 wherein said first and second diodes have a reverse breakdown voltage greater than any voltage applied to the input of the overcurrent detector circuit.

4. The overcurrent detector circuit as recited in claim 3 wherein said first and second transistors are bipolar NPN transistors.

5. The overcurrent detector circuit as recited in claim 4 wherein said third transistor is a bipolar PNP transistor.

6. The overcurrent detector circuit as recited in claim 5 wherein a voltage from the drain to source of the power MOSFET is known when conducting the predetermined current.

7. The overcurrent detector circuit as recited in claim 6 wherein said voltage at the input of the overcurrent detector circuit is equal to a voltage across said resistor when equal currents are being conducted by said first and second transistors.

8. The overcurrent detector circuit as recited in claim 7 wherein a current of said second current source multiplied by a resistance of said resistor yields a voltage equal to a voltage at the input of the overcurrent detector circuit when said power MOSFET is conducting the predetermined current.

9. The overcurrent detector circuit as recited in claim 8 wherein a current conducted by said second transistor is less than said current of said second current source when the power MOSFET is conducting less than the predetermined current thereby disabling said third transistor.

10. The overcurrent detector circuit as recited in claim 9 wherein said current conducted by said second transistor is greater than said current of said second current source when the power MOSFET is conducting greater than the predetermined current thereby enabling said third transistor for generating a signal corresponding to an overcurrent condition at the output of the overcurrent detector circuit.

* * * * *